United States Patent [19]

Hu et al.

[11] Patent Number: 4,908,328
[45] Date of Patent: Mar. 13, 1990

[54] HIGH VOLTAGE POWER IC PROCESS

[75] Inventors: Chenming Hu, Alamo; Steven P. Sapp, Felton, both of Calif.

[73] Assignee: National Semiconductor Corporation, Santa Clara, Calif.

[21] Appl. No.: 361,894

[22] Filed: Jun. 6, 1989

[51] Int. Cl.[4] .................... H01L 21/20; H01L 21/302
[52] U.S. Cl. ........................................ 437/63; 437/67; 437/54; 437/78; 437/90; 357/55; 148/DIG. 12; 148/DIG. 26; 148/DIG. 135
[58] Field of Search ........................ 437/40, 51, 54, 62, 437/63, 64, 66, 67, 68, 77, 78, 89, 90, 203, 915; 148/DIG. 12, DIG. 26, DIG. 135; 357/55

[56] References Cited

U.S. PATENT DOCUMENTS

| 4,501,060 | 2/1985 | Frye et al. | 437/62 |
| 4,593,458 | 6/1986 | Adler | 437/62 |
| 4,837,186 | 6/1989 | Ohata et al. | 148/DIG. 12 |
| 4,851,366 | 7/1989 | Blanchard | 437/61 |

OTHER PUBLICATIONS

Ohata, Y., et al., "Dielectrically Isolated Intelligent Power Switch," *IEEE 1987 Custom Int. Cir. Conference*, pp. 443-446.

Ohashi, H., et al., "Improved Dielectrically Isolated Device Integration", *IEEE IEDM Tech. Digest*, 1986, pp. 210-213.

Primary Examiner—Brian E. Hearn
Assistant Examiner—T. N. Quach
Attorney, Agent, or Firm—Gail W. Woodward; Lee Patch; Michael A. Glenn

[57] ABSTRACT

A process is disclosed for forming an oxide isolated semiconductor wafer which can include the formation of an associated high voltage transistor. The same wafer can include a plurality of low voltage transistors which can be connected in the form of circuitry that can control the high voltage transistor. Thus, a single IC chip can be fabricated for a power control function. The process includes bonding a first wafer to a second wafer using oxide (11/14), forming a groove (18) through the oxide (15), backfilling with epitaxially regrown semiconductor (19) to provide a high voltage section, and subsequently forming the high voltage transistor, e.g. NPN or DMOS devices, in said section.

8 Claims, 2 Drawing Sheets

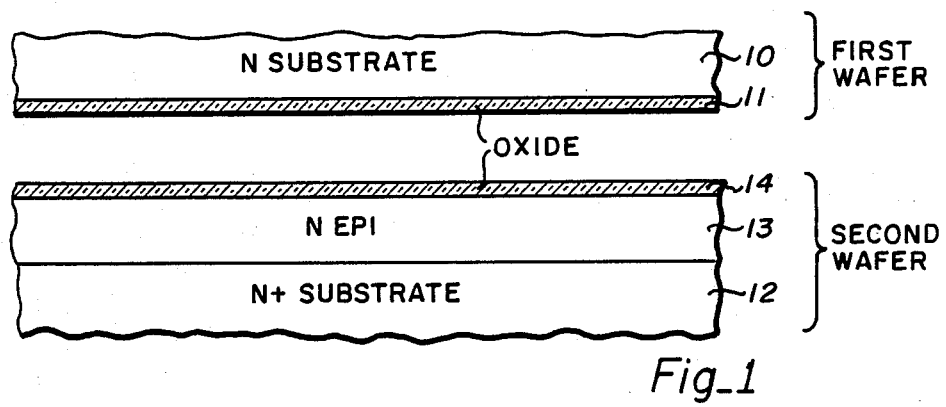
Fig_1
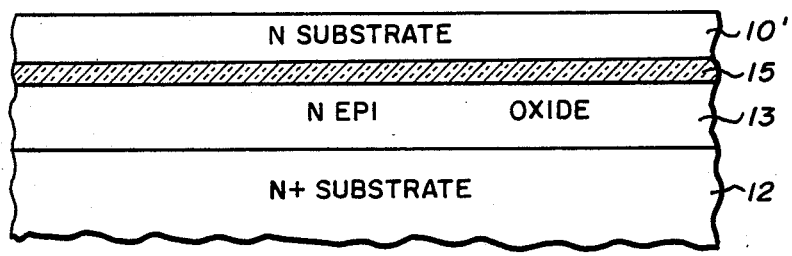
Fig_2
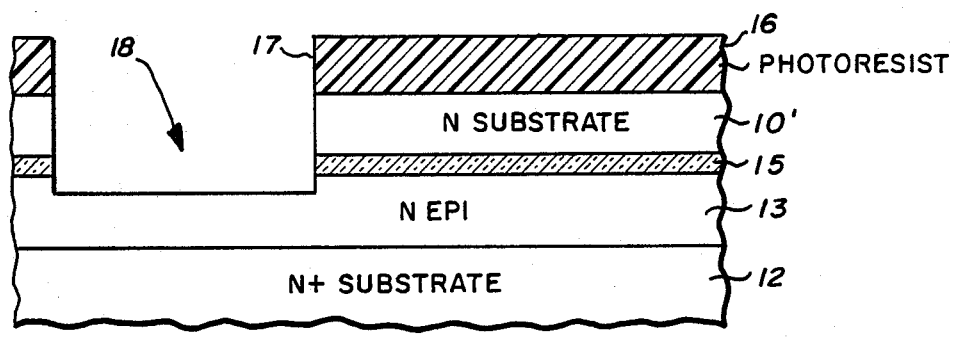
Fig_3
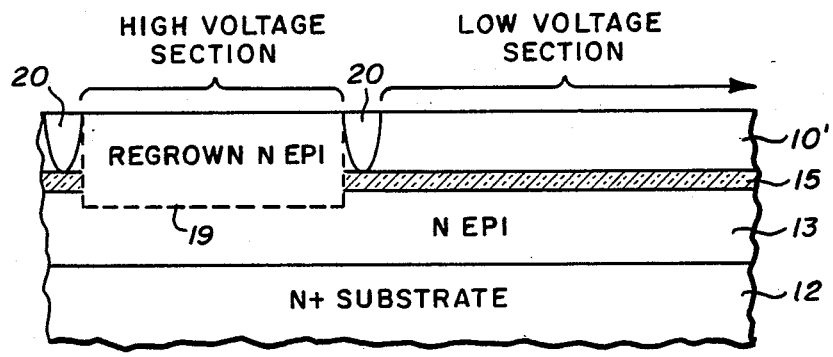
Fig_4

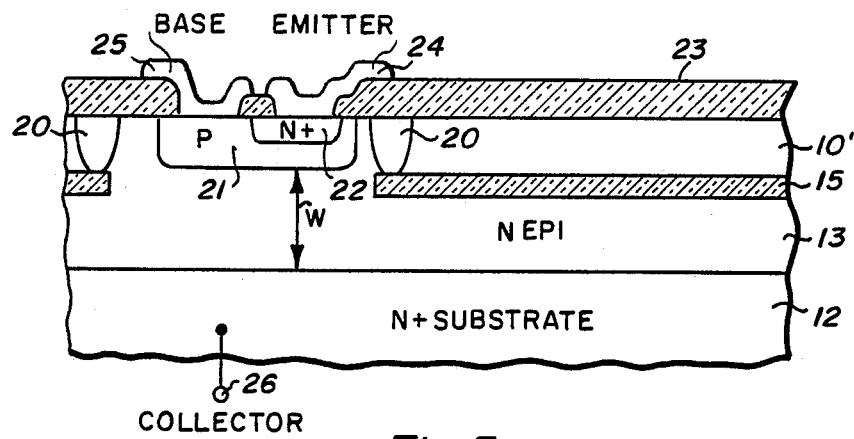
Fig._5
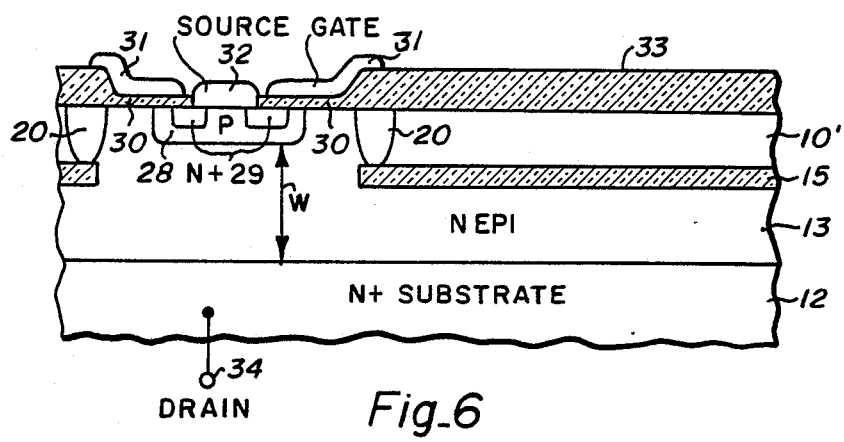
Fig._6
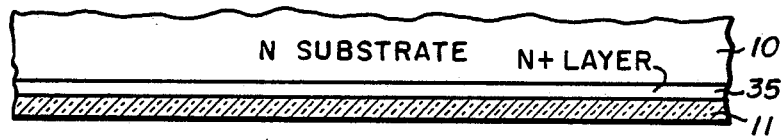
Fig._7

HIGH VOLTAGE POWER IC PROCESS

BACKGROUND OF THE INVENTION

Dielectric isolation is employed to fabricate semiconductor devices wherein metal-oxide-semiconductor (MOS) or other integrated circuit (IC) elements can be combined with a bipolar junction transistor (BJT), double diffused metal-oxide semiconductor (DMOS) or other high voltage semiconductor device. The DMOS transistor is capable of controlling large currents and is widely regarded as a favored way to control large amounts of power.

A useful process of making dielectric isolated devices was published by Yu Ohata et al. in the IEEE 1987 CUSTOM INTEGRATED CIRCUITS CONFERENCE. The paper titled DIELECTRICALLY ISOLATED INTELLIGENT POWER SWITCH appears on pages 443-446 of the conference publication and sets forth a process for making what is called the Toshiba Corporation Intelligent Power Switch. Here a first N-type semiconductor wafer, having a resistivity selected to optimize the device to be fabricated, is provided with a mirror finish. It is then implanted with donor impurities to create an N+ surface layer. The mirror surface is then oxidized. A second wafer of N+ conductivity is also provided with a mirror finish and this surface oxidized. It was discovered that when such oxidized wafers are washed to develop hydrophilic surfaces, a strong bond forms at room temperature when the wafer faces are placed together. A subsequent heat treatment causes the oxides to join together to form a buried oxide which can act to electrically isolate the material in the two wafers. Typically, the first wafer can then be ground and etched to provide the desired thickness of N type material which exists over an N+ layer that faces the dielectric isolation. The resulting composite semiconductor wafer can be trench etched to isolate a plurality of N type tubs and the trench faces oxidized to complete the dielectric isolation. If desired, the oxidized trenches can be back filled with polycrystalline silicon (polysilicon). To create a vertical DMOS transistor a deep trench can be etched through the N type wafer, its N+ region and the dielectric whereby the second, or N+, wafer is exposed. Then an epitaxial deposition is employed to fill the deep trench with semiconductor material having a resistivity suitable for the DMOS transistor drain and the wafer ground and polished to restore the surface. The gate oxide and gate conductor (typically doped polysilicon) are then located over a first region of the epitaxially deposited silicon. A double diffusion produces the source and channel regions in the surface of the exposed semiconductor. A metal electrode, located over the diffusions so as to short them together in a second region, provides the DMOS source electrode. The drain electrode is available at the N+ substrate formed by the second wafer. Electrically it is the backside of the composite wafer structure.

The region of the composite wafer structure, where the epitaxially backfilled trench is located, will contain a power switch while the adjacent region will contain MOS or BJT devices. These latter devices are conventional and they are isolated by means of diffusions or groove etching of the N and N+ layers in the first wafer.

As shown above, the power switch region can contain a DMOS device which has its drain dedicated to the composite wafer backside. In many cases, the resulting breakdown voltage is not as high as might be desired. For example, the Toshiba Corporation Intelligent Power Switches are rated at 60 and 100 volts for two and twenty ampere devices.

SUMMARY OF THE INVENTION

It is an object of the invention to provide a process for making dielectrically isolated DMOS, BJT's or some other semiconductor device having high breakdown voltages in a substrate that includes conventional low voltage dielectrically isolated devices.

It is a further object of the invention to provide a process for making dielectrically isolated IC wafers that also contain a high voltage transistor device such as BJT or DMOS.

These and other objects are achieved as follows. A first N+ silicon wafer is provided with an N type epitaxial layer having a resistivity and thickness suitable for the DMOS transistor drain. The wafer surface is polished to a mirror finish and oxidized. A second wafer having a resistivity suitable for low voltage IC manufacturing has its face polished to a mirror finish and oxidized. The oxidized faces are then washed and pressed together with the resultant hydrophilic surface bonding. The assembled wafers are then heat treated to cause the oxides to merge, thus forming a composite wafer having an oxide isolation buried layer. Then the thickness of the second layer is reduced by a combination of grinding or lapping and etching to a predetermined thickness. At this point the composite wafer is trench etched where high voltage transistors are to be created. This trench is made to penetrate the oxide isolation and to extend into the epitaxial layer material of the first wafer. Then, epitaxial silicon is deposited to backfill the trench so that it extends the first wafer to fill the trench. Lapping and etching are then employed to render the surface flat and to leave the trench filled with epitaxial material. Desirably, the material that now exists over the oxide isolation is on the order of about three microns thick. This layer can easily be penetrated by diffusion or trench etching to isolate tubs for low voltage IC fabrication. In the high voltage regions the thin epitaxial layer exists over the original epitaxial layer provided over the first wafer substrate. Thus, the material can easily be made thick enough to provide breakdown voltages in excess of 1000 volts. Thus, when a vertical NPN transistor, vertical DMOS or other vertical power device is fabricated therein it can be made to have a very high breakdown voltage.

BRIEF DESCRIPTION OF THE DRAWING

FIGS. 1 through 4 represent a fragment of an IC wafer showing the processing of an oxide isolated region.

FIG. 5 shows a fragment of an oxide isolated IC wafer including a high voltage vertical NPN transistor.

FIG. 6 shows a fragment of an oxide isolated IC wafer including a high voltage DMOS vertical transistor.

FIG. 7 is a fragment of a wafer showing an alternative embodiment of the first wafer of FIG. 1.

The drawing is not to scale. The dimensions, particularly the vertical ones, are exaggerated to more clearly present the invention.

DESCRIPTION OF THE INVENTION

In FIG. 1 a first silicon wafer 10 of N type conductivity is provided with an oxide film 11. The resistivity, which is typically 1-10 ohm centimeters, is chosen to provide the proper value for fabricating the low voltage circuit elements. The wafer, of which a fragment is shown, is typically about 500-700 microns thick and is first polished to produce an extremely flat mirror finish. The face is then oxidized to form oxide 11 to a thickness of about a micron.

A second silicon wafer 12, having a resistivity of 0.0005 to 0.02 ohm centimeters and a thickness of about 500-700 microns is provided with one or more epitaxial layers represented by 13. This layer is typically about 20-100 microns thick and has a resistivity of about 10-100 ohm centimeters. The surface of epitaxial layer 13 is polished to a mirror finish and provided with an oxide layer 14.

The two wafers are washed to render the oxide surfaces hydrophilic and they are pressed together. The extremely smooth hydrophilic oxides will cling together and form a strong bond between the two wafers. A subsequent heat treatment will cause the oxides to coalesce together to form a unitary oxide 15 of FIG. 2. The composite wafer structure shown in FIG. 2 includes the N type wafer 10' thinned down to a few microns which is an impossibly thin condition for a self-supporting wafer. Such a wafer would be too fragile to handle. However, when the second wafer is used as a handle by means of the above-described lamination process, layer 10' can be achieved by grinding or lapping and etching to the desired thickness. The final treatment of the surface of layer 10' is such that active semiconductor devices can be fabricated therein conventionally by the well known planar processes.

As shown in FIG. 3, the wafer is coated with a photoresist 16 which has been processed to have an opening 17 therein. The wafer is then subjected to isotropic etching, such as a reactive ion etch (RIE), as is well-known in the art, to etch the wafer only inside opening 17. This etching creates a trench shown at 18 and is continued until layer 10' and oxide 15 are fully penetrated and it extends a short distance into layer 13.

At this point, the photoresist 16 is removed and a layer of silicon epitaxially grown over the wafer. The layer is thick enough to completely fill the trench. Then, the surface of the wafer is lapped and etched back to the original surface that was present in FIG. 3 after photoresist removal. If desired, the lapping and etching can be continued to remove a small surface layer so as to expose a virgin wafer surface. At this point, the structure of FIG. 4 is present. The regrown material in the trench is shown by dashed outline 19, but this material may be indistinguishable from that of layer 13. It is to be understood that the regrown material deposited into trench 18 could be of a different resistivity and/or conductivity type depending upon the kind of high voltage device to be incorporated into the structure. This region forms what will be called the high voltage section. The material that exists over oxide 15 is known as the low voltage section. It is in this latter section that the conventional IC components will be fabricated. Isolation region 20 can be composed of heavily doped P+ material created by a conventional isolation diffusion. Alternatively, the isolation can be achieved by a narrow RIE trench process. This latter method is preferred because it takes up less surface area than a diffusion. In any event, because layer 10' is made so thin, the isolation can readily penetreate it thereby minimizing the surface requirements of isolation. If trench etching is employed for isolation, it is ordinarily followed by an oxidation step so that the trench walls are coated with oxide. This can be continued until the trenches are completely filled with oxide or the oxide-lined trenches can be backfilled with polysilicon in the conventional manner. This creates a planar wafer surface.

After the wafer of FIG. 4 is obtained, it is coated with a planar oxide preparatory to planar processing. As shown in FIG. 5, a planar power transistor is to be created within the high voltage section of the wafer. A double diffusion planar process is employed to create P type base region 21 and N+ type emitter region 22. Field oxide 23 exists around the device. Emitter metal 24 contacts region 22 through a contact hole in the oxide and base metal 25 contacts base 21 through a contact hole. The transistor collector is composed primarily of epitaxial layer 13 and is thereby dedicated to substrate 12. Thus, the power transistor collector of FIG. 5, which is shown schematically at 26, is the backside of the composite wafer. When the IC chip is extracted from the wafer and soldered to a metal heat sink in the final packaging, the heat sink is also the collector connection. Since dimension W extends for a substantial distance in the transistor structure, the breakdown voltage can be high. Typically, a voltage of 600 to 1200 volts can be achieved with reasonable device dimensions. The actual value will be determined by the semiconductor resistivity and dimension W.

While not shown, it is to be understood that the power transistor can employ a surface geometry that occupies a substantial total area. The emitter and base diffusions can be extended laterally, for example, in an interdigitated structure, as is well known in the power transistor art, to achieve the desired current carrying capacity. Furthermore, while an NPN transistor is shown, all conductivity types can be complemented to produce a PNP power transistor.

FIG. 6 shows an n-channel vertical power DMOS transistor fabricated into the high voltage portion of the substrate shown in FIG. 4. A P type diffusion 28 is formed into the regrown epitaxial material. An N+ diffusion ring 29 is formed within region 28 as shown. It can be seen that the outer reaches of diffusion ring 29 closely approach the outer reaches of region 28. This difference determines the DMOS transistor channel length. Gate oxide 30 and gate 31 (which is preferably composed of doped polysilicon) span the separation between the outer reaches of regions 28 and 29. Thus, that portion of region 28 that lies under gate 31 and between N+ region 29 and the regrown epitaxial extension of region 13, forms a transistor channel. A metal contact 32 is deposited within a contact cut made through oxide 30 so that the inner portions of regions 28 and 29 are commonly contacted and shorted together. Thus, metal contact 32 becomes the transistor source electrode which is also connected to the transistor back gate electrode.

When gate 31 is biased positively with respect to source terminal 32, the positive carriers in that portion of region 28 lying under gate 31 will be repelled. At a sufficiently high gate potential, the surface portion of region 28 will be inverted to N type and a channel created. Thus, electrons will flow from source 29, through the channel, to the regrown epitaxial material extension of region 13 and out to substrate 12. This current will be controlled by the gate bias and a DMOS transistor function is available. The dimension W and the resistivity of the N type material will determine the transistor drain breakdown voltage. As was the case for the bipolar NPN transistor, this breakdown can be as high as 600 to 1200 volts.

It is to be understood that all of the conductivity types of FIG. 6 could be complemented. This would result in a P channel vertical DMOS transistor.

FIG. 7 shows an alternative embodiment of the invention. The showing relates to the first wafer of FIG. 1. The starting wafer 10 is selected to have a resistivity suitable for the fabrication of the low voltage transistors. However, a heavily doped N+ layer 35 is created in its surface. This can be done, for instance, using ion implantation of N type impurities. It is preferred that a slow diffuser, such as arsenic or antimony, be employed and that the doping be sufficient to create a highly conductive N+ layer. Following the creation of layer 35 the wafer face is polished to a mirror finish, if necessary, and oxide layer 11 formed as was done in the FIG. 1 embodiment. In the subsequent fabrication process layer 35 will form a buried high-conductivity layer under the device layer 10'. This layer will not change significantly during subsequent high temperature processing because it employs a slow diffuser. Such a layer has value in improving the performance of the low voltage transistors. This improvement is well known in conventional buried layer IC design.

Since multiple epitaxial layers of either type and various resistivity can be used in both the first and second wafers, a wide variety of high voltage devices can be combined with a variety of low voltage elements.

We have described embodiments combining high voltage NPN or DMOS devices with PMOS or CMOS low voltage devices. The invention can be used to combine many different devices. In addition to high bipolar voltage and vertical DMOS, insulated gate bipolar transistors (IGBT), as described by D. S. Kuo et al., in Solid-State Electronics, Vol 29, No 12, pp 1229–1237, 1986, can also be fabricated. The method can also be used with MOS-controlled thyristors as described by V. A. K. Temple et al., in the Technical Digest of the Instrumentation Electron Devices Meeting, Dec. 1988, pp 618–621. Other high voltage vertical power devices compatible with this invention will be obvious to those skilled in the art.

Any one of these high voltage devices can be combined with a wide variety of low voltage IC fabrication methods. NMOS, CMOS, Bipolar, or BiCMOS which combines CMOS and Bipolar elements, can be used for the low voltage control circuitry.

The invention has been described and preferred embodiments shown. When a person skilled in the art reads the foregoing description, alternatives and equivalents, within the spirit and intent of the invention, will be apparent. Accordingly, it is intended that the scope of the invention be limited only by the following claims.

We claim:

1. A process for forming high voltage transistors in a semiconductor wafer which will include low voltage conventional transistors, said process including the steps:

starting with a first wafer of semiconductor material having a resistivity suitable for the fabrication of said low voltage transistors and a second wafer of semiconductor material having a resistivity that is substantially lower than that of said first wafer;

forming at least one epitaxial layer of semiconductor material on one face of said second wafer;

polishing a face of said first wafer and the face of said epitaxial layer of said second wafer to produce flat mirror finishes thereon;

forming an oxide on each wafer on said polished faces;

washing said oxide coated wafer faces to render them hydrophilic;

placing said hydrophilic faces together to produce adhesion between said first and second wafers;

heating said adhered wafers to coalesce said oxide coatings thereby to join said first and second wafers into a unitary structure;

grinding and etching said exposed face of said first wafer until a predetermined thickness thereof remains;

etching a groove in said first wafer that extends through it and through said oxide that joins said wafers together to expose a portion of said epitaxial layer;

backfilling said groove with epitaxially deposited semiconductor material;

shaping the exposed surface of said first wafer for subsequent planar processing; and forming a high voltage transistor in said backfilled semiconductor material.

2. The process of claim 1, wherein said step of forming at least one epitaxial layer includes the deposition of a plurality of epitaxial layers.

3. The process of claim 1 wherein said grinding and etching step removes a major portion of said first wafer.

4. The process of claim 3 wherein the remaining thickness of said first wafer is on the order of a few microns.

5. The process of claim 1 wherein said first wafer is provided with a high conductivity face by doping the face to be oxidized prior to oxidation.

6. The process of claim 5 wherein said doping involves a slow diffusing impurity having the same doping conductivity type as that of said first wafer.

7. The process of claim 1 wherein said step of forming a high voltage transistor includes the steps:

diffusing an impurity into said backfilled material having an opposite conductivity characteristic to a first depth that is less than the final thickness of said first wafer to create a transistor base region;

diffusing an impurity having the same conductivity characteristic as said backfilled material into said base region within the confines thereof and to a lesser depth to create a transistor emitter region; and providing contacts to said base and emitter regions and a contact to said second wafer to form a collector contact.

8. The process of claim 1 wherein said step of forming a high voltage transistor includes the steps:

diffusing an impurity having an opposite conductivity type into said backfilled material to a first depth that is less than the final thickness of said first wafer to create a transistor channel region;

diffusing an impurity having the same conductivity type as said backfilled material into said channel region within the confines thereof and to a lesser depth to create a a transistor source region;

forming a gate oxide that overlaps the channel region that exists between the edge of channel diffusion and the source diffusion;

forming a gate conductor over said gate oxide thereby to provide a transistor gate;

forming a metal contact to both said source and said channel regions outside the confines of said gate whereby said source is contacted and shorted to said channel thereby to form a transistor source combined with a transistor back gate contact; and forming a contact to said second wafer thereby to provide a transistor drain electrode.

* * * * *